United States Patent [19]
Bhatia et al.

[11] Patent Number: 4,752,813
[45] Date of Patent: Jun. 21, 1988

[54] SCHOTTKY DIODE AND OHMIC CONTACT METALLURGY

[75] Inventors: Harasaran S. Bhatia, Hopewell Junction; Satya P. Bhatia, Wappingers Falls; Cyril P. de Vries, Poughkeepsie; Douglas A. Grose, Wappingers Falls, all of N.Y.

[73] Assignee: International Business Machines Corporation, Armonk, N.Y.

[21] Appl. No.: 895,018

[22] Filed: Aug. 8, 1986

[51] Int. Cl.[4] .................. H01L 29/48; H01L 23/48; H01L 29/72
[52] U.S. Cl. ........................................ 357/15; 357/67; 357/71; 357/34
[58] Field of Search .................. 357/71 S, 67 S, 67, 357/15, 34

[56] References Cited
U.S. PATENT DOCUMENTS

| 3,598,997 | 8/1971 | Baertsch | 357/15 |
| 4,316,209 | 2/1982 | Ho et al. | 357/71 S |
| 4,356,622 | 11/1982 | Widmann | 357/71 S |
| 4,638,551 | 1/1987 | Einthoven | 357/15 |
| 4,675,715 | 6/1987 | Lepselter et al. | 357/67 R |

OTHER PUBLICATIONS

"Refractory silicides for integrated circuits" by Murarka, J. Vac Sci Technol., vol 17, No. 4, Jul./Aug. 1980.

Primary Examiner—William D. Larkins
Assistant Examiner—David R. Josephs
Attorney, Agent, or Firm—William T. Ellis

[57] ABSTRACT

A Schottky barrier diode and ohmic contact metallurgy which is especially suited for shallow-junction bipolar semiconductor devices. The metallurgy comprises a thin layer of an at least 95 atomic % pure Schottky metal disposed in the contact openings on a shallow-junction semiconductor device to a thickness of less than 850 angstroms. An electrically conducting barrier layer is then disposed over the thin Schottky metal layer, with the barrier layer being of a material which does not react with either the Schottky metal or the semiconductor material in the contact openings to thereby prevent semiconductor material from diffusing past the barrier layer. An electrical contact layer is then deposited over the barrier layer. The doping of the semiconductor material in the individual contact openings determines whether an ohmic contact or a Schottky barrier diode is formed. The resulting ohmic contact metal and Schottky barrier metal do not penetrate through to the shallow junction of the semiconductor device. Additionally, the Schottky barrier diodes maintain a desired barrier height despite repeated heat treatments.

21 Claims, 1 Drawing Sheet

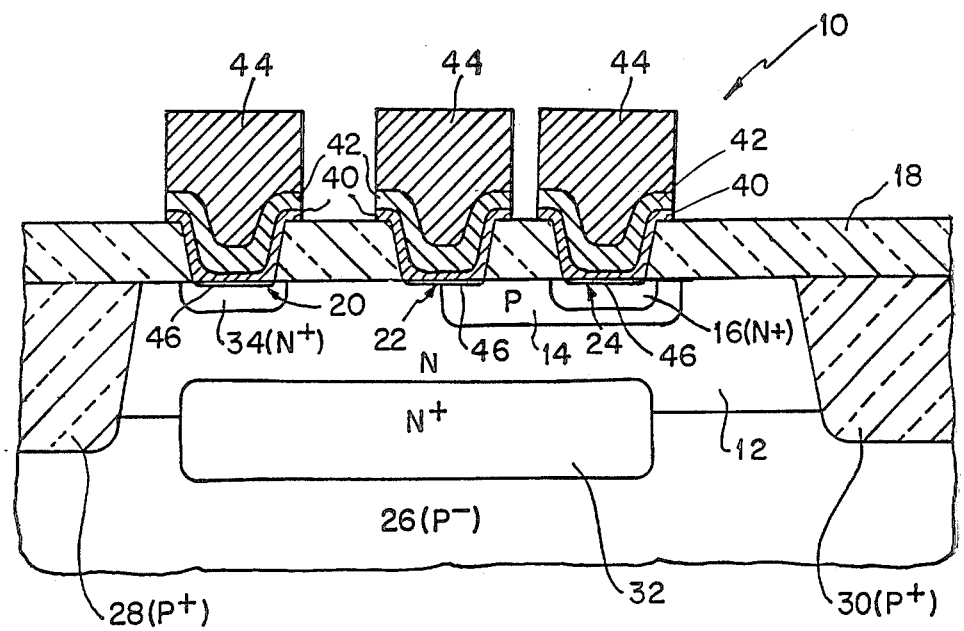

SCHOTTKY DIODE AND OHMIC CONTACT METALLURGY

BACKGROUND OF THE INVENTION

The present invention relates generally to semiconductor contact metallurgies, and more particularly to a Schottky barrier diode and ohmic contact metallurgy especially designed for use with shallow-junction semiconductor devices.

There is a continuing need for increasing the frequency of operation and the switching speed of bipolar semiconductor devices. Shallow junction bipolar semiconductor devices have been found especially suited for such high frequency operation. An important circuit element required for use with the shallow-junction semiconductor devices in order to facilitate such high frequency operation is the Schottky barrier diode. However, a problem with current Schottky diode technology is that such diodes do not maintain a constant predetermined barrier voltage height, but rather have a barrier height which varies as a function of the number of heat treatments utilized in fabricating the device. Specifically, each additional heat treatment applied to a given semiconductor chip causes the various metals in the Schottky diode metallurgy to diffuse into the underlying semiconductor, thereby changing the metal/semiconductor atomic ratios and thus the barrier height voltage for the diodes.

A further limiting factor is that there is a strong preference for depositing the metallurgy for the ohmic contacts at the same time as the metallurgy for the Schottky barrier diode in order to save process steps. Thus, the Schottky diode metallurgy must be compatible with ohmic contact device environments.

This compatibility requirement is a major stumbling block in shallow-junction semiconductor device processing. This is because many of the ohmic contacts to shallow-junction devices are disposed so that they are separated from underlying pn junctions in the device by only a thin semiconductor layer. The above-described metal-semiconductor interdiffusion in such an ohmic contact can thus electrically short through to the underlying pn junction. By way of example, a shallow-junction high frequency double-diffused NPN transistor might have an emitter region which is diffused into the base region to a shallow depth of only approximately 1,500 to 2,000 angstroms. Due to the small geometry of this shallow double-diffused transistor, the edge of the emitter diffusion opening in the oxide mask layer thereof is so close to the emitter-base junction at the surface of the wafer that horizontal migration of the interdiffusion between the metal and the semiconductor caused by the alloying process of the metallurgy can electrically short out the base-emitter junction. Likewise, because the base-emitter junction is shallow relative to the emitter contact diffusion opening in the oxide mask, vertical migration of the interdiffusion between the metal and the semiconductor can also electrically short out the emitter-base junction. Moreover, if this diffusion does not cause a direct short, then it facilitates a low breakdown voltage characteristic and high leakage currents in the ohmic contacts.

Aluminum, with a barrier height of 700 mV, is a prime candidate as a Schottky metal. However, aluminum in direct contact with an underlying semiconductor material is especially prone to the above-described interdiffusion due to its rapid diffusion characteristic and the high solubility of semiconductors therein at elevated temperatures.

Various solutions have been advanced in the prior art to solve this aluminum-semiconductor interdiffusion problem. A typical solution is disclosed in U.S. Pat. No. 4,316,209 wherein the aluminum metallurgy is alloyed with at least one noble metal from the group of Pd and Pt and at least one region of this metallurgy is alloyed with silicon. The resulting metallurgy is a ternary alloy of either $Al_3Pd_4Si$ or $Al_3Pt_4Si$. This metallurgy consumes only approximately 1/7 of the amount of silicon as prior art Schottky metallurgies. However, this metallurgy has the previously described problem that each additional heat treatment causes the ratio of the Al to the Pd to the Si to change, thereby changing the barrier voltage height in the Schottky device.

The invention as claimed is intended to remedy the above described constant barrier height problem for Schottky diodes subjected to repeated heat treatments, while preventing the penetration of the Schottky metallurgy all the way through to the shallow junction of the semiconductor device. The advantages offered by the present invention are that a Schottky metallurgy structure and a method for fabricating that structure are provided which prevent the electrical shorting of shallow-junction semiconductor devices by the interdiffusion of the Schottky metallurgy with the semiconductor material of the device. The Schottky diode metallurgy of the present invention permits the fabrication of shallow-junction bipolar semiconductor devices with metallurgies which are especially prone to interdiffusion with the underlying semiconductor material of the bipolar device. In particular, the Schottky diode metallurgy permits the fabrication of shallow junction semiconductor devices with aluminum Schottky diodes without the electrical shorting of the junction which normally occurs with such a combination.

SUMMARY OF THE INVENTION

Briefly, the present invention comprises a Schottky barrier diode and ohmic contact metallurgy which is especially suited for shallow-junction bipolar semiconductor devices because it is not prone to electrical shorts via metal diffusion through to the shallow junction, and because the resulting Schottky diodes maintain a desired barrier height despite repeated heat treatments, comprising:

a thin layer of Schottky metal disposed in a contact opening on a shallow-junction bipolar semiconductor device, wherein said thin Schottky metal layer has a thickness of less than 850 angstroms;

an electrically conducting barrier layer disposed over said thin Schottky metal layer, said barrier layer being formed from a material which does not react with said Schottky metal or the semiconductor material in the semiconductor device contact opening so that this contact opening semiconductor material is prevented from diffusing past said barrier layer; and a contact layer disposed over said barrier layer for making electrical contact thereto.

In a preferred embodiment of the present device, the thin Schottky metal layer is at least 95 atomic % of a single Schottky metal. It is also preferred that this thin Schottky metal layer have a thickness of less than 650 angstroms, with a preferred thickness of on the order of 500 angstroms. It is further preferred that the contact layer comprise an aluminum alloy. In one embodiment, the thin Schottky metal layer may also be aluminum.

The present invention further comprises a method for forming the above described Schottky barrier diodes and ohmic contacts on a shallow junction bipolar semiconductor device. This method comprises the step of opening a plurality of contact holes in a shallow-junction semiconductor device including at least one contact hole to a semiconductor layer, wherein this contact hole is separated from a pn junction by a thickness of less than 2000 angstroms. The method further comprises the steps of depositing a thin layer of Schottky metal to a thickness of less than 850 angstroms simultaneously into the plurality of contact holes; depositing an electrically conducting barrier layer over the thin Schottky metal layer, with the barrier layer being of a material which does not react with the Schottky metal or with the exposed material of the shallow-junction semiconductor device; and depositing a contact layer over the barrier layer for making electrical contact thereto.

In a preferred embodiment of the method, the thin Schottky metal is at least 95% pure with a thickness of less than 650 angstroms.

BRIEF DESCRIPTION OF THE DRAWING

The FIGURE is a sectioned schematic side view of one embodiment of the Schottky diode and ohmic contact metallurgy of the present invention.

DETAILED DESCRIPTION OF THE PREFERRED EMBODIMENT

The present invention is directed to very fast shallow junction bipolar devices which also require Schottky barrier diodes. Specifically, the present invention is directed to preventing the natural interdiffusion between semiconductor materials and a Schottky metallurgy from causing an electrical short through to the shallow junction of the device. The solution to this electrical shorting problem permits the use of Schottky metallurgies which are highly soluble to the underlying semiconductor material therebelow at elevated temperatures.

The present invention is disclosed in the context of a silicon NPN transistor of the type described in U.S. Pat. No. 4,491,860. It is, of course, understood that the present invention has wide applicability to devices formed in a variety of other semiconductor materials such as GaAs. Likewise, the present invention is not restricted to use with NPN transistors, but rather has wide applicability to any bipolar semiconductor device utilizing a pn junction.

The FIGURE shows a typical shallow-junction NPN transistor design 10 wherein Schottky barrier diodes and ohmic contact are to be formed. The basic transistor 10 comprises a collector layer 12 of N-doped silicon, a base layer 14 of P-doped silicon, and an emitter layer 16 of N+ doped silicon. By way of example, the collector layer 12 may comprise an epitaxially grown layer doped with arsenic to a level in the range of $10^{15}$–$10^{17}$ atoms per c.c. and to a thickness of 10,000 angstroms. The base layer 12 may comprise a layer diffused with a P-type dopant, such as boron, to a level in the range of $10^{18}$–$10^{19}$ atoms per c.c. and formed to a thickness typically of less than 3500 angstroms for a shallow junction device. Finally, the emitter layer 16 may comprise a layer diffused with an N type dopant such as phosphorous or arsenic to a doping level in the range of $10^{20}$–$10^{21}$ atoms per c.c. and to a thickness in the range of less than 2000 angstroms, and preferably less than 1500 angstroms.

An oxide layer 18 is formed over the top surface of this transistor. A collector contact opening 20, a base/-Schottky contact opening 22, and an emitter contact opening 24 are formed in the oxide layer 18 to facilitate contact to the transistor 10.

In the example embodiment of the FIGURE, the transistor 10 is disposed on a substrate 26 of [111] or [100] silicon which is lightly P-doped to have a resistivity of about 7–21 ohms cm. The transistor 10 is flanked on each side by isolation regions 28 and 30. The isolation regions 28 and 30 may comprise an oxide layer diffused with a P-type dopant such as boron. These isolation regions are formed through the epitaxial collector layer 12 down to the underlying substrate 26 (typically a thickness of 0.5 to 1.0 micrometers).

The transistor 10 may also conveniently include a buried collector contact layer 32 and a collector contact region 34 to reduce the electrical resistance between the collector contact opening 20 and the collector-base junction. For the present example, the buried collector contact layer 32 and the collector contact region 34 may comprise N+ diffusions of a dopant such as arsenic.

Process steps for forming the above-described transistor 10 are well known in the art, and are set forth with particularity in the book *Modern Microelectronics*, by Max Fogiel, Research and Education Association, New York 1972, pp. 463–472.

When a contact metallurgy is disposed in the contact openings 20, 22 and 24, it will form either a Schottky barrier diode or an ohmic contact, depending on the level of doping in the underlying semiconductor level. In the present example, the $10^{20}$–$10^{21}$ atoms per c.c. doping of the emitter layer 16 causes the contact metallurgy disposed in the contact opening 24 to form an ohmic contact. Likewise, the heavy N+ doping of the collector contact region 34 causes the contact metallurgy disposed in the contact opening 20 to form an ohmic contact. Also, the $10^{18}$–$10^{19}$ atoms per c.c. P doping of the base layer 14 disposed below a portion of the contact opening 22 causes the contact metallurgy disposed in that portion of the contact opening to form an ohmic contact. However, the $10^{15}$–$10^{17}$ atoms per c.c. N doping of the collector layer 12 disposed below the remaining portion of the contact opening 22 causes the contact metallurgy disposed thereon to form a Schottky barrier. Accordingly, a Schottky barrier diode is formed and connected across the base and the collector of the transistor 10 at the contact opening 22.

These contact metallurgies have a strong tendency to diffuse into their underlying semiconductor layers during heat treatments. Such diffusion is of particular concern for the device shown in the FIGURE due to the very shallow emitter-base and base-collector junctions used in the device. The emitter-base junction is especially prone to being electrically short-circuited due to the diffusion during heat treatments of the contact metallurgy in contact opening 24 through the thin emitter layer 16 (less than 2000 angstroms) to the emitter-base junction therebelow. Contact metallurgy diffusion resulting in an electrical short can also occur from the contact opening 22 through the base layer 14 (less than 3500 angstroms) to the base-collector junction.

Such diffusion is especially prone to occur through silicon device layers. Moreover, as the semiconductor diffuses into the metal contact layer and the metal contact layer diffuses down into the semiconductor, the barrier heights for any Schottky barrier diodes formed by the contact metallurgy change. This change in barrier height is directly related to semiconductor-metal proportions in the Schottky layer. The semiconductor-metal proportions change with every additional heat treatment. Note that this variable barrier height variation problem occurs even with deep junction devices.

The present invention comprises a thin layer 40 of Schottky metal disposed in the contact openings 20, 22, and 24. This thin layer is designed to have a thickness of less than 850 angstroms. Any of a wide variety of Schottky metals may be utilized for the thin layer. In this regard, see "Silicides For VLSI Applications", by S. P. Murarka, Academic Press, Inc., Orlando, Fla., page 15, Table V. However, note that the present invention is especially suited for Schottky metals which are subject to rapid diffusion and a high solid solubility when in contact with an exposed semiconductor layer at elevated temperatures. One such Schottky metal with a high semiconductor solid solubility is aluminum. Note that substantially pure aluminum, at least 95 atomic % pure, yields a very desirable Schottky barrier height of 700 mV.

An electrically conducting barrier layer 42 is then disposed over the thin Schottky metal layer 40. This barrier layer must be a material which does not react with the Schottky metal layer 40 or the exposed semiconductor material in the contact openings 20, 22, and 24. Accordingly, this barrier layer 42 functions to prevent the device semiconductor material from diffusing beyond the thin Schottky metal layer 40. Finally, a contact layer metallurgy 44 is disposed over the barrier layer 42 for making electrical contact to other devices.

When the device shown in the FIGURE is subjected to various heat treatments, the metal in the thin Schottky metal layer 40 interdiffuses with the semiconductor material in the contact openings 20, 22, and 24. However, because the thin layer 40 is less than 850 angstroms in thickness, its solubility limit (saturation point) with respect to the semiconductor material exposed in the contact openings is quickly reached. Accordingly, the interdiffusion between the Schottky metal and the semiconductor material is limited to a thin layer 46 in the contact openings. By way of example, for a thin Al layer 40 with a thickness of on the order of 500 angstroms, the interdiffusion layer 46 will be on the order of 10 angstroms. It can thus be seen that the Al-semiconductor interdiffusion will not cause an electrical short from the Schottky barrier metal layer 40 through the first emitter layer 16 (1500 angstroms) to the emitter-base pn junction therebelow, or through the base layer 14 (3000 angstroms) to the base-collector pn therebelow. Once this thin Schottky metal layer 40 is saturated to its limit with semiconductor material from the contact opening, no further semiconductor material absorption takes place, regardless of the number of heat treatments applied to the device in the future.

The barrier layer 42 functions to prevent the semiconductor material in the contact openings from diffusing beyond the thin Schottky metal layer 40. Such further diffusion of the semiconductor material would cause additional amounts of the semiconductor material to be absorbed, and an attendant downward diffusion of the Schottky metal from the thin layer 40. This barrier layer 42 thus should be formed from a material which does not react with the Schottky metal or with the semiconductor material exposed in the contact openings. Typical barrier materials which may be utilized, by way of example, are Cr, $Cr_xO_y$, TiW, W and Mo. The thickness of this barrier layer 22 is not critical, except that it must be thick enough to prevent semiconductor material from diffusing beyond the thin Schottky layer 40. By way of example, this barrier layer 42 may be deposited to a thickness of on the order of 1100-1200 angstroms.

The contact metallization layer 44 may be implemented by a variety of different metallization systems. In a preferred embodiment, this contact layer 44 comprises an aluminum alloy with approximately 97 atomic % Al and approximately 3 atomic % Cu. Such a contact metallurgy is advantageous due to its excellent conducting characteristics and its adherence to semiconductor materials. This aluminum alloy metallization may be conveniently applied by means of evaporation and photoresist techniques. Again, the thickness of this contact layer 44 is not critical. By way of example, this contact layer 44 may have a thickness of 8700 angstroms.

It can be seen that the use of the barrier layer 42 after the thin Schottky metal layer 40 is especially important with the use of the aluminum alloy contact metallization for the layer 44. Without the barrier layer 42, the semiconductor material from the contact openings could diffuse up past the thin Schottky layer 40, and that layer would not become saturated.

In a preferred embodiment, the thin Schottky metal layer 40 comprises at least 95 atomic % of a single Schottky metal. Additional heat treatments to this thin 95% pure Schottky metal will not cause the ratio of the Schottky metal to the semiconductor material to change, once the Schottky metal has reached its saturation point. Thus, the barrier voltage height for the Schottky barrier diode of this device remains constant.

In one embodiment of the present invention, the Schottky metal may comprise 97 atomic % pure aluminum to a thickness of less than 650 angstroms, and preferably in the range of 500 angstroms or less. The remaining % of the Schottky layer may be copper.

A preferred method of making the device shown in the FIGURE will be described in the context of a silicon device. Again, note that the present invention is applicable to a variety of other semiconductor materials, including gallium arsenide. Referring now to the method for forming the present bipolar device, the first step is to open a plurality of contact holes in a shallow-junction semiconductor device, including at least one contact hole in a semiconductor layer surface, which contact hole is separated from a pn junction by a thickness of less than 2000 angstroms. Such contact openings are formed in this top surface by means of conventional techniques. By way of example, a conventional photoresist and oxide etch process may be used to form contact apertures in the silicon dioxide layer. More specifically, a photoresist layer is deposited on the oxide mask, the photoresist layer is then exposed to light in accordance with a desired pattern, the pattern is developed through unexposed portions of the photoresist, and the exposed portions of the oxide layer are then removed with a suitable etchant. The remaining photoresist is then removed by stripping to leave an oxide mask with windows for the subsequent metal deposition. Any lift-off structures are also formed at this time.

The next step comprises the deposition of the thin layer 40 of Schottky metal into the contact openings on this surface. Again, there are a number of convenient methods known in the art for depositing the Schottky metal to a thickness of less than 850 angstroms. By way of example, for an Al deposition, this device may be cleaned and placed into a vacuum evaporation apparatus. In such an apparatus, the aluminum is first melted, and then vaporized by a heat filament. This evaporation process is typically performed at the pressure of $10^{-7}$ Torr or less. This evaporation is continued until 850 angstroms of aluminum are deposited into the contact openings 20, 22, and 24, as shown in the FIGURE. It is, of course, understood that other techniques such as electron beam vacuum evaporation or sputtering may be utilized in place of the vacuum evaporation technique to realize the metal deposition.

The next step in the method is to deposit an electrically conducting barrier layer 42 onto the thin Al layer 40 in the contact openings 20, 22, and 24. As noted above, this barrier layer 42 may be formed by a variety of different barrier metallurgies which are capable of preventing the interdiffusion of semiconductor material. Such barrier metallurgies include Cr, $Cr_xO_y$, TiW, W, Mo, etc. This barrier layer 42 may also be applied by means of a vacuum evaporation technique, as is well known in the art. As noted above, this barrier metallurgy should be sufficiently thick to prevent the semiconductor material from the first layer from diffusing up into the aluminum contact material. By way of example, this barrier layer may have a thickness of 1100-1200 angstroms.

Finally, the contact metallurgy layer 44 is deposited over the barrier layer 42. The purpose of this contact metallurgy layer 44 is to make electrical contact to other devices in the circuit. As previously noted, a preferred contact metallurgy is an aluminum alloy of 97 atomic % Al and 3 atomic % Cu. This contact layer 44 may also be deposited onto the barrier layer 42 in the contact openings by means of vacuum evaporation techniques. By way of example, this deposition may be to a thickness of 8700 angstroms.

The above fabricated device is then sintered at a temperature of 400° C. for 1 hour in order to reduce interfacial oxide. For a thin aluminum layer 40 with a thickness of 500 angstroms, the rapid diffusion and high solubility between the thin Al layer 40 and the semiconductor material of the contact openings will only consume 10 angstroms of silicon despite the rapid diffusion and high solid solubility of silicon in aluminum at elevated temperatures.

This rapid saturation of the thin Schottky metal layer and the resultant small diffusion depth in the underlying semiconductor permit the metallurgy of the present invention to be used for both Schottky diodes and for ohmic contacts, even if the ohmic contacts are to be formed in contact openings over shallow junctions. Thus, this metallurgy can be used for both ohmic contacts and Schottky diodes simultaneously. The resulting Schottky diodes have a high breakdown voltage characteristic and an excellent ideality factor.

The Schottky barrier diode and ohmic contact metallurgy of the present invention is suited for use with any type of bipolar semiconductor device, but is especially suited for shallow-junction semiconductor devices used in high frequency and fast switching applications. The Schottky diode of the device has a Schottky barrier voltage height which is not a function of the number of heat treatments or the sintering temperatures utilized therein. This design is not subject to electrical shorts despite the fact that a Schottky barrier diode is fabricated in combination with a shallow junction bipolar semiconductor device. In particular, the present invention permits the use of aluminum Schottky barrier diodes with shallow junction bipolar semiconductor devices.

While the present invention has been particularly shown and described with reference to preferred embodiments therefor, it is understood by those skilled in the art that the foregoing and other changes in form and detail may be made therein without departing from the spirit and scope of the present invention.

We claim:

1. A Schottky barrier diode and ohmic contact metallurgy which is especially suited for shallow-junction bipolar semiconductor devices because it is not prone to electrical shorts via metal diffusion through to the shallow junction, and because the resulting Schottky diodes maintain a desired barrier height despite repeated heat treatments, comprising:

a thin layer of Schottky metal comprising at least 95 atoms % of Al disposed in a contact opening through an insulating layer down to semiconductor material in a shallow junction bipolar semiconductor device, wherein said thin Schnottky metal layer has a thickness of less than 850 angstroms;

an electrically conducting barrier layer disposed over said thin Schottky metal layer, said barrier layer being formed from a material which does not react with said Schottky metal or with the semiconductor material in the semiconductor device contact opening so that this contact opening semiconductor material is prevented from diffusing past said barrier layer; and a contact layer disposed over said barrier layer for making electrical contact thereto.

2. A metallurgy as defined in claim 1 wherein said thin Schottky metal layer has a thickness of less than 650 angstroms.

3. A metallurgy as defined in claim 1, wherein said thin Schottky metal layer has a thickness of on the order of 500 angstroms.

4. A metallurgy as defined in claim 1, wherein said barrier layer comprises a material chosen from the group consisting of Cr, $Cr_xO_y$, Mo, TiW, and W.

5. A bipolar device as defined in claim 1, wherein said semiconductor material in said semiconductor device contact opening is silicon.

6. A shallow-junction bipolar semiconductor device including a metallization system for Schottky barrier diodes and ohmic contacts, which system is not prone to electrical shorts via metal diffusion through to the shallow junction, and which provides Schottky diodes which maintain a desired barrier height despite repeated heat treatments, comprising:

a semiconductor element including a plurality of contact openings, a first semiconductor region and a second semiconductor region having different conductivities and forming a pn junction, said first semiconductor region having a first contact opening thereto formed through an insulating layer down to a surface thereof disposed less than 2000 angstroms from said pn junction;

a thin layer of Schottky metal comprising at least 95 atoms % Al, suitable for forming a Schottky barrier, disposed in a plurality of said contact openings including said first contact opening in the surface of said first semiconductor region, with said thin Schottky metal layer having a thickness of less than 850 angstroms;

an electrically conducting barrier layer disposed over said thin Schottky metal layer, said barrier layer being formed from a material which does not react with said Schottky metal or with the material of said first semiconductor region so that the first semiconductor region material is prevented from diffusing past said barrier layer; and a contact layer disposed over said barrier layer for making electrical contact thereto.

7. A bipolar device as defined in claim 6, wherein second semiconductor region includes a second contact opening therein, wherein said second semiconductor region is doped so that any Schottky metal disposed thereover forms a Schottky barrier diode;

wherein said thin Schottky metal layer is disposed in said second contact opening to form a Schottky barrier diode; and wherein said electrically conducting barrier layer is disposed over said thin Schottky metal layer, followed by said contact layer.

8. A device as defined in claim 7, wherein said thin Schottky metal layer has a thickness of less than 650 angstroms.

9. A device as defined in claim 7, wherein said thin Schottky metal layer has a thickness of on the order of 500 angstroms.

10. A device as defined in claim 7, wherein said barrier layer comprises a material chosen from the group consisting of Cr, $Cr_xO_y$, Mo, TiW, and W.

11. A device as defined in claim 7, wherein said thin Schottky metal layer has a thickness of less than 650 angstroms.

12. A device as defined in claim 11, wherein said contact layer is Al.

13. A device as defined in claim 12, wherein the material of said first and second semiconductor regions is silicon.

14. A bipolar device as defined in claim 6, wherein said substrate further includes a third semiconductor region disposed adjacent to said second semiconductor region, with a single second contact opening disposed over a portion of both of said second and third semiconductor regions, wherein said second semiconductor region is lightly doped at said portion in said contact opening so that any Schottky metal disposed thereover forms a Schottky barrier diode, and wherein said third semiconductor region is doped sufficiently at said portion in said contact opening so that any Schottky metal disposed thereover forms an ohmic contact; and wherein said thin Schottky metal layer is disposed in said second contact opening to form a Schottky barrier diode over said second semiconductor region, and to form an adjacent ohmic contact over said third semiconductor region; and wherein said electrically conducting barrier layer is disposed over said thin Schottky metal layer in said second contact opening, followed by said contact layer.

15. A device as defined in claim 14, wherein said thin Schottky metal layer has a thickness of less than 650 angstroms.

16. A device as defined in claim 14, wherein said thin Schottky metal layer has a thickness of on the order of 500 angstroms.

17. A device as defined in claim 14, wherein said barrier layer comprises a material chosen from the group consisting of Cr, $Cr_xO_y$, TiW, Mo and W.

18. A device as defined in claim 14, wherein said contact layer comprises an aluminum alloy.

19. A device as defined in claim 14, wherein said thin Schottky metal layer has a thickness of less than 650 angstroms.

20. A device as defined in claim 19, wherein said contact layer is Al.

21. A device as defined in claim 12, wherein the material of said first, second, and third semiconductor regions is silicon.

* * * * *